| (12) | United States Patent | (10) Patent No.: | US 8,243,175 B2 |
|---|---|---|---|
| | Kobayashi et al. | (45) Date of Patent: | Aug. 14, 2012 |

(54) SOLID-STATE IMAGING DEVICE

(75) Inventors: Hiroya Kobayashi, Hamamatsu (JP); Hiroshi Akahori, Hamamatsu (JP); Masaharu Muramatsu, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 587 days.

(21) Appl. No.: 10/554,106

(22) PCT Filed: Apr. 14, 2004

(86) PCT No.: PCT/JP2004/005334
§ 371 (c)(1),
(2), (4) Date: Aug. 28, 2006

(87) PCT Pub. No.: WO2004/095831
PCT Pub. Date: Nov. 4, 2004

(65) Prior Publication Data
US 2007/0064134 A1    Mar. 22, 2007

(30) Foreign Application Priority Data
Apr. 24, 2003 (JP) ................ P2003-120343

(51) Int. Cl.
*H04N 3/14* (2006.01)
*H04N 5/335* (2011.01)

(52) U.S. Cl. ........ 348/294; 348/298; 348/302; 348/308; 348/335

(58) Field of Classification Search .......... 348/294, 348/298, 302, 308, 335, 340, 345, 348; 359/819, 359/822
See application file for complete search history.

(56) References Cited

U.S. PATENT DOCUMENTS

| 5,705,807 | A | * | 1/1998 | Throngnumchai et al. ... | 250/214 P |
| 6,049,470 | A | * | 4/2000 | Weale ........................... | 361/820 |
| 6,122,009 | A | * | 9/2000 | Ueda ............................ | 348/335 |
| 6,768,516 | B2 | * | 7/2004 | Yamada et al. .............. | 348/340 |
| 6,795,120 | B2 | * | 9/2004 | Takagi et al. ................ | 348/294 |

FOREIGN PATENT DOCUMENTS

| EP | 0 828 298 | 3/1998 |
| JP | 63-160370 | 7/1988 |
| JP | 2-36057 | 3/1990 |
| JP | 04-317280 | 11/1992 |
| JP | 5-183135 | 7/1993 |
| JP | 10-32323 | 2/1998 |
| JP | 10-84509 | 3/1998 |
| JP | 11-275407 | 10/1999 |
| JP | 2002-252797 | 9/2002 |
| JP | 2002-368949 | 12/2002 |
| KR | 0279305 | 2/2001 |
| KR | 2001-0112047 | 12/2001 |

* cited by examiner

*Primary Examiner* — Yogesh Aggarwal
(74) *Attorney, Agent, or Firm* — Drinker Biddle & Reath LLP

(57) ABSTRACT

A solid-state imaging apparatuses IS1 comprises a package P1, a CCD chip 11, chip resistor arrays 21, etc. In package P1, a mounting portion 2, for mounting CCD chip 11 and chip resistor arrays 21, is disposed so as to protrude into a hollow portion 1. Mounting portion 2 has a first planar portion 3 and second planar portions 4, and first planar portion 3 and second planar portions 4 are formed to be stepped with respect to each other. CCD chip 11 is mounted and fixed on first planar portion 3 via a spacer 13. Chip resistor arrays 21 are mounted and fixed on second planar portions 4. Using the step difference between first planar portion 3 and second planar portions 4, CCD chip 11 and chip resistor arrays 21 are positioned proximally.

4 Claims, 10 Drawing Sheets

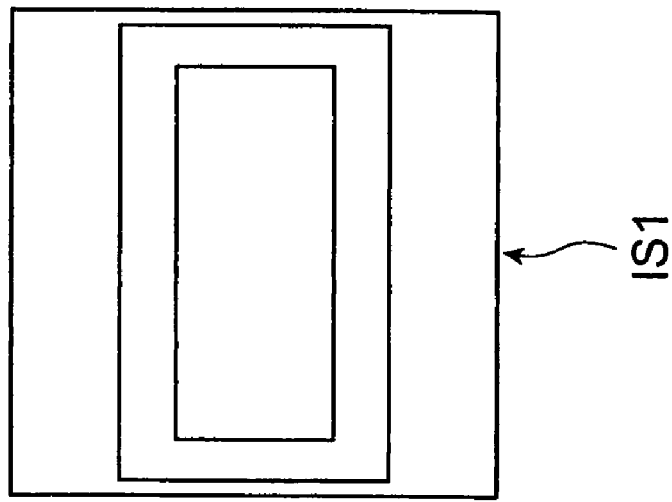
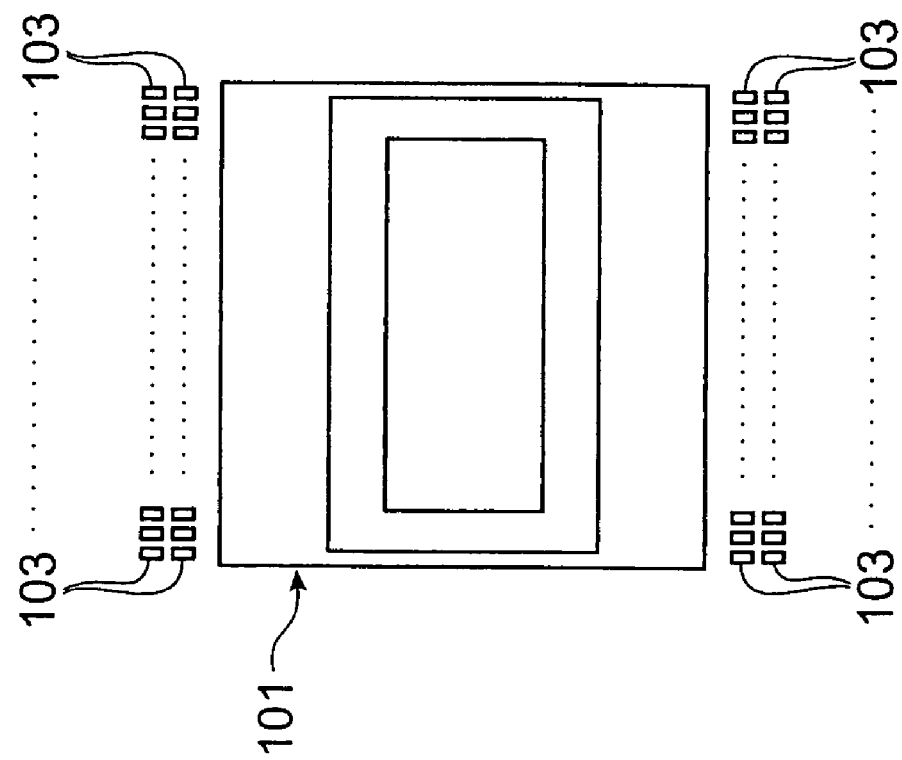

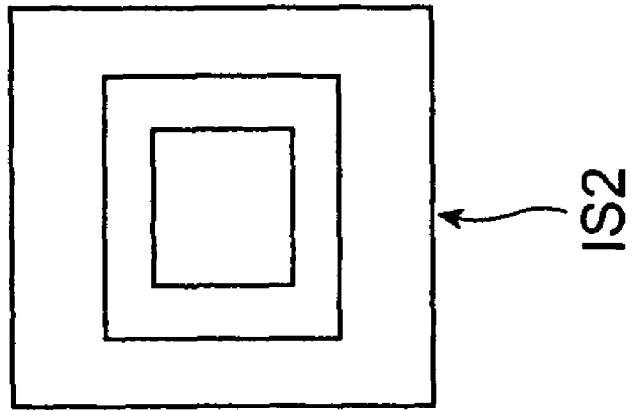
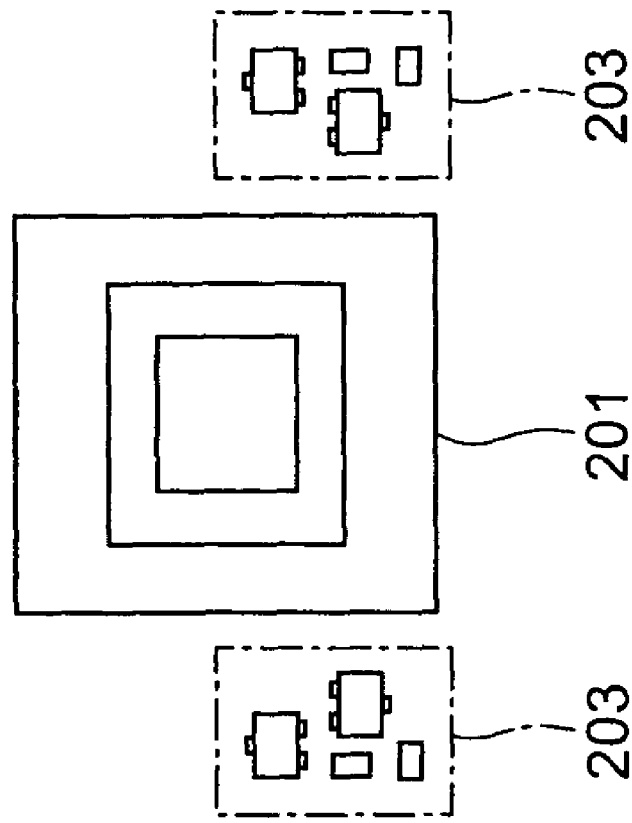

SOLID-STATE IMAGING DEVICE

TECHNICAL FIELD

The present invention relates to a solid-state imaging apparatus.

BACKGROUND ART

There is known a solid-state imaging apparatus comprising: a solid-state imaging element, having an energy ray sensitive portion; and a package, housing the solid-state imaging element; and having signal processing circuits, which process signals output from the above-mentioned solid-state imaging element and are disposed at the exterior of the package (see, for example, Patent Document 1).

[Patent Document 1] Japanese Published Unexamined Patent Application No. H4-317280

DISCLOSURE OF THE INVENTION

However, when the signal processing circuits are disposed at the exterior of the package, the signal transmission paths (electrical wirings) from the solid-state imaging element to the signal processing circuits become long and the parasitic capacitance of the signal transmission paths becomes large. As a result, the waveforms of the signals output from the solid-state imaging element become damped and high-speed response properties are degraded.

The present invention has been accomplished in view of the above point and an object of the invention is to provide a solid-state imaging apparatus, with which the parasitic capacitance of signal transmission paths is reduced to enable restraining of the damping of the waveforms of signals output from a solid-state imaging element and improvement of the high-speed response properties.

In order to achieve the above object, a solid-state imaging apparatus according to the present invention comprises: a solid-state imaging element; having an energy ray sensitive portion, a signal processing circuit, processing signals output from the solid-state imaging element; and a package, housing the solid-state imaging element and the signal processing circuit; wherein the signal processing circuit is positioned at a planar portion of the package that differ from a planar portion at which the solid-state imaging element is positioned.

In the solid-state imaging apparatus according to the present invention, since the signal processing circuit is positioned at a planar portion of the package that differ from a planar portion at which the solid-state imaging element is positioned, the solid-state imaging element and the signal processing circuit are positioned proximally with respect to each other. Signal transmission path from the solid-state imaging element to the signal processing circuit is thereby made short and the parasitic capacitance of the signal transmission path is made small. As a result, the damping of the waveforms of the signal output from the solid-state imaging element can be restrained and the high-speed response properties can be improved.

Also, a solid-state imaging apparatus according to the present invention comprises: a solid-state imaging element, having an energy ray sensitive portion; a signal processing circuit, processing signals output from the solid-state imaging element; and a package, housing the solid-state imaging element and the signal processing circuit; wherein the package has a first planar portion and a second planar portions, formed to be stepped with respect to the first planar portion, and wherein the solid-state imaging element is positioned at the first planar portion while the signal processing circuit is positioned at the second planar portion.

In the solid-state imaging apparatus according to the present invention, the signal processing circuit is positioned proximally to the solid-state imaging element by making use of the step difference between the first planar portion and the second planar portion. Signal transmission path from the solid-state imaging element to the signal processing circuit is thereby made short and the parasitic capacitance of the signal transmission path is made small. As a result, the damping of the waveforms of the signal output from the solid-state imaging element can be restrained and the high-speed response properties can be improved.

As described above, by each of the solid-state imaging apparatuses according to the present invention, the solid-state imaging apparatus is provided with which the parasitic capacitance of the signal transmission path is reduced to enable restraining of the damping of the waveforms of the signal output from the solid-state imaging element and improvement of the high-speed response properties.

Preferably, the signal processing circuit includes a load resistor that is electrically connected to an output terminal of the solid-state imaging element. With the composition, since the solid-state imaging element and the load resistor are positioned apart from each other, even if the load resistor generate heat, adverse effects on the characteristics of the solid-state imaging element (for example, increasing of the dark current) can be prevented.

Also preferably, the signal processing circuit includes a load resistor, with which one end is electrically connected to an output terminal of the solid-state imaging element and the other end is grounded, and a buffer amplifier, having a bipolar transistor that is electrically connected to the output terminal of the solid-state imaging element. With the composition, since the solid-state imaging element and the load resistor are positioned apart from each other, even if the load resistor generates heat, adverse effects on the characteristics of the solid-state imaging element (for example, increasing of the dark current) can be prevented. Also, since the bipolar transistor is high in driving ability with respect to the load resistor, effects due to the parasitic capacitance of the signal transmission path subsequent the buffer amplifier can be alleviated.

BRIEF DESCRIPTION OF THE DRAWINGS

FIG. 4A is a schematic view showing a solid-state imaging apparatus of a conventional art.

FIG. 4B is a schematic view showing the solid-state imaging apparatus of the first embodiment.

FIG. 9A is a schematic view showing a solid-state imaging apparatus of a conventional art.

FIG. 9B is a schematic view showing the solid-state imaging apparatus of the second embodiment.

BEST MODES FOR CARRYING OUT THE INVENTION

Solid-state imaging apparatuses of embodiments of the present invention shall now be described with reference to the drawings. Identical elements or elements with identical functionality will be denoted by the same reference symbols in the description, without redundant description.

(First Embodiment)

Figure 1:
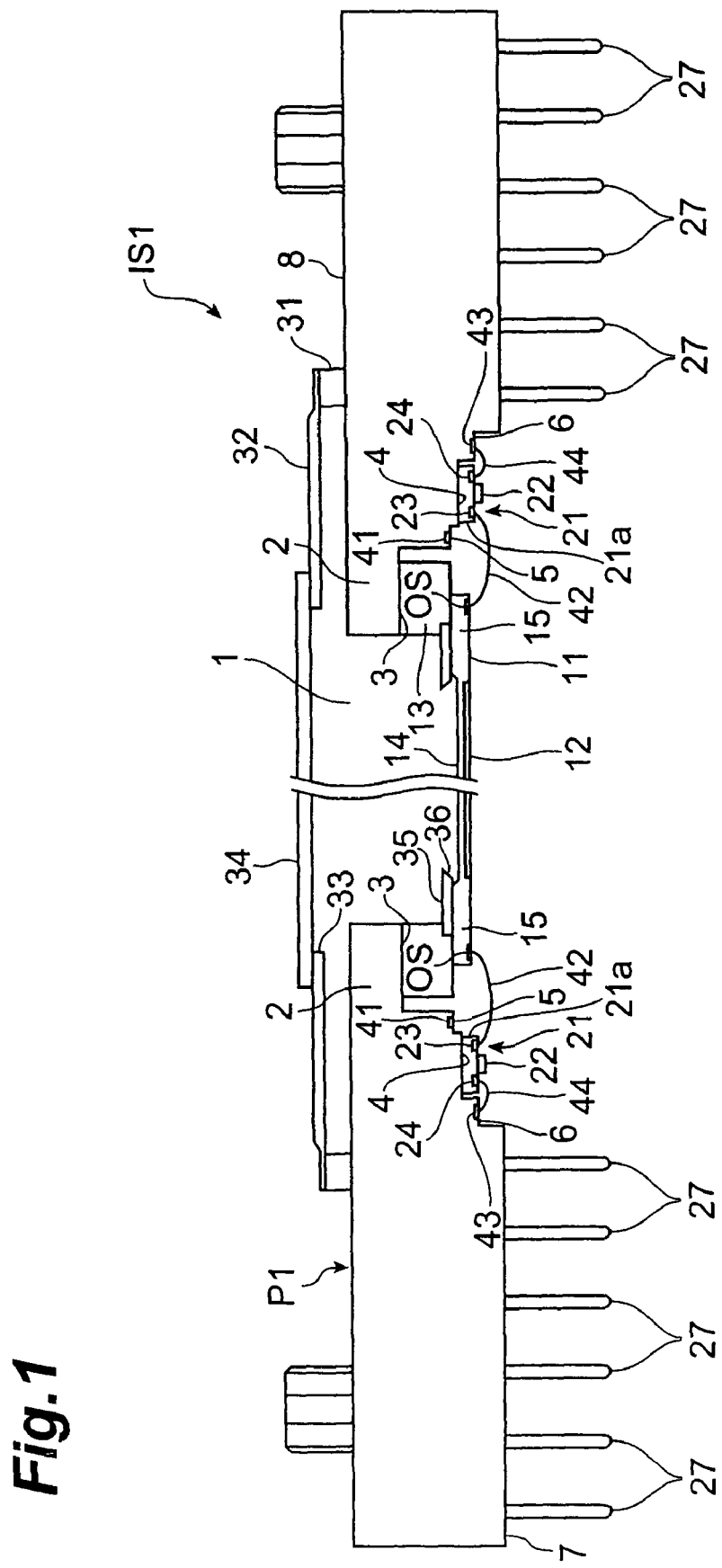
FIG. 1 is a schematic view for describing the sectional composition of a solid-state imaging apparatus of a first embodiment.
Figure 2:
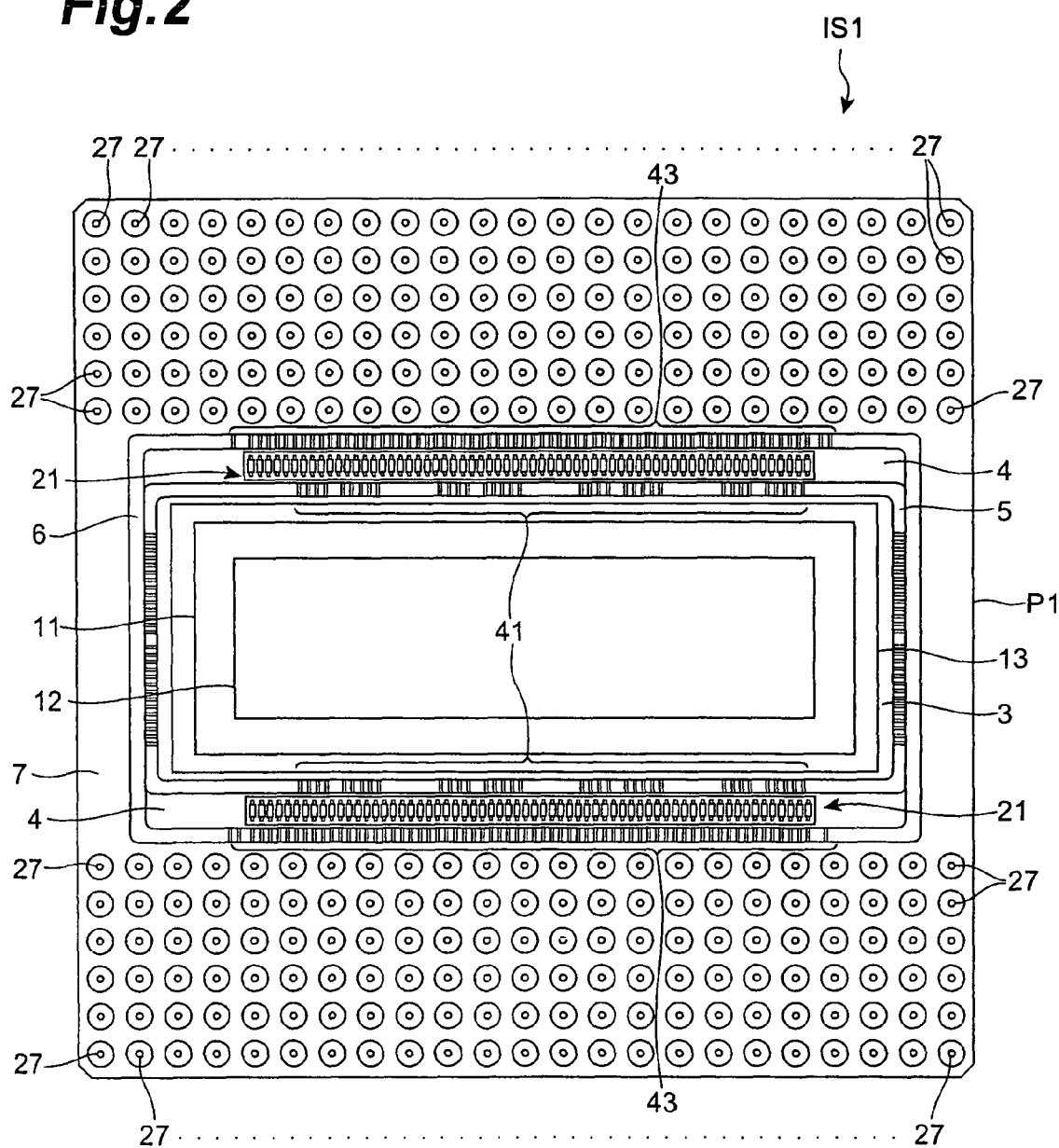
FIG. 2 is a plan view of the solid-state imaging apparatus of the first embodiment.
Figure 3:
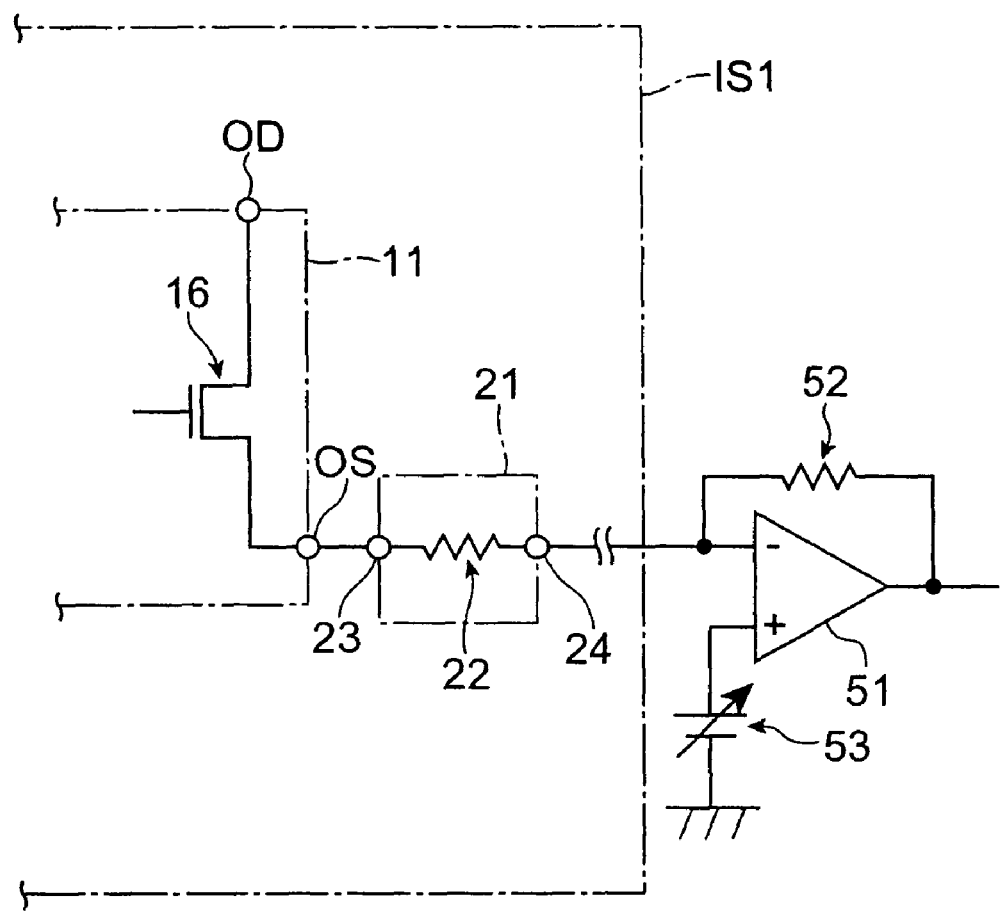
FIG. 3 is a circuit diagram for describing the composition of a signal processing circuit.

First, the composition of a solid-state imaging apparatus of a first embodiment shall be described based on FIGS. 1 to 3. FIG. 1 is a schematic view for describing the sectional composition of the solid-state imaging apparatus of the first embodiment. FIG. 2 is a plan view of the same solid-state imaging apparatus of the first embodiment. FIG. 3 is a circuit diagram for describing the composition of a signal processing circuit. FIG. 2 is a view viewed from a back surface (side opposite the side onto which energy rays are made incident) of the solid-state imaging apparatus.

A solid-state imaging apparatus IS1 of the first embodiment comprises a ceramic package P1, a back-illuminated CCD chip 11 (solid-state imaging element), chip resistor arrays 21, etc. At a central portion of package P1 is formed a hollow portion 1, which extends in a predetermined direction of package P1. In package P1, a mounting portion 2, for mounting CCD chip 11 and chip resistor arrays 21, is disposed so as to protrude into hollow portion 1. Mounting portion 2 has a first planar portion 3 for positioning of CCD chip 11 and second planar portions 4 for positioning of chip resistor arrays 21. First planar portion 3 and second planar portions 4 are formed to be stepped with respect to each other.

Mounting portion 2 furthermore has a third planar portion 5 and a fourth planar portion 6. Third planar portion 5 is positioned between first planar portion 3 and second planar portions 4 and is formed to be stepped with respect to first planar portion 3 and second planar portions 4. Fourth planar portion 6 is positioned between a back surface 7 of package P1 and second planar portions 4 and is formed to be stepped with respect to back surface 7 of package P1 and second planar portions 4. A plurality of electrode pins 27 for external connection are positioned on back surface 7 of package P1.

CCD chip 11 has an energy ray sensitive portion 12, which converts incident energy rays into charges. CCD chip 11 is mounted on first planar portion 3 of mounting portion 2 via a spacer 13 so that the back surface will be the energy ray incident surface and is fixed onto the mounting portion 2 (package P1). CCD chip 11 is formed of a silicon substrate of a thickness of approximately 300 μm. With back-illuminated CCD chip 11, the substrate must be made thin and a potential slope must be formed from the incident surface (back surface) side.

At a back surface side region (inner side region) of CCD chip 11 that includes a region corresponding to energy ray sensitive portion 12, a thin portion 14, which is thinned to a thickness of approximately 10 to 30 μm (that is, etched to a depth of approximately 270 to 290 μm), is formed. A structure having such a thin portion 14 is formed by depositing a silicon nitride film onto the silicon substrate, patterning the film to a desired shape by a photolithography process, and using the film as a mask to etch the silicon substrate using an etching solution, comprising KOH, while leaving the peripheral portion of the substrate, which is covered by the silicon nitride film, in the thick state.

Spacer 13 is formed of a material that has a higher thermal expansion coefficient at a predetermined temperature range (for example, 133° C.) than the thermal expansion coefficient of CCD chip 11 (silicon), and in the present embodiment, is formed of alumina or other ceramic material. The thermal expansion coefficient of silicon at 133° C. is $2.5 \times 10^{-6}$(/° C.) and the thermal expansion coefficient of alumina at 133° C. is $6.5 \times 10^{-6}$(/° C.). Spacer 13 is adhered and fixed to package P1 by an adhesive agent (not shown). Also, the back surface side of a frame portion 15 of CCD chip 11 is adhered and fixed to spacer 13 by an adhesive agent (not shown).

On front surface (energy ray incident side surface) 8 of package P1 at the periphery of hollow portion 1, a seal ring 31 is fixed by brazing, etc., so as to surround hollow portion 1 (CCD chip 11). A cap 32 is seam-welded to seal ring 31. As mentioned above, cap 32 has its outer peripheral portion mounted on and seam-welded to seal ring 31 and has an opening portion 33, provided at a position opposing thin portion 14 of CCD chip 11. Cap 32 is formed integrally of kovar (fernico) and a gold plating is applied to its front surface 8.

A window member 34, which allows the transmission of energy rays (light, electron beam, etc.), is fixed to cap 32 so as to cover opening portion 33. Window member 34 is formed of a plate-like quartz glass base material, is arranged to transmit ultraviolet rays, and its energy ray incident surface and energy ray exit surface are polished. Also, window member 34 is fixed to cap 32 by the end portions of the energy ray incident surface being fixed across the entire periphery onto the upper surface (the surface at the side opposite the surface opposing CCD chip 11) of cap 32 via an adhesive layer (not shown).

Though not illustrated, the portion of hollow portion 1 of package P1 at the opposite side of the energy ray incident side portion may be sealed by a bottom cover or by filling with a resin material, etc.

A plurality of first package side electrodes 41, for connection with CCD chip side electrodes (not shown) of CCD chip 11, are disposed on third flat portion 5 of mounting portion 2. Each first package side electrode 41 is electrically connected to a predetermined electrode pin among a plurality of electrode pins 27 via an internal wiring (not shown) formed inside package P1. The CCD chip side electrodes and first package side electrodes 41 are electrically connected via bonding wires (not shown). Transfer signals and other signals are thus sent from the exterior to CCD chip 11 via predetermined electrode pins, internal wirings, first package side electrodes 41, bonding wires, and CCD chip side electrodes.

Each chip resistor array 21 has a plurality of resistors 22, which are formed in array form on a substrate 21a. On substrate 21a, an input terminal (input electrode) 23 and an output terminal (output electrode) 24 are formed for each resistor 22. Each chip resistor array 21 is mounted on a second planar portion 4 of mounting portion 2 via an adhesive layer (not shown) and is thereby fixed to mounting portion 2 (package P1). Input terminals 23 are electrically connected via bonding wires 42 to output terminals (electrodes) OS of CCD chip 11.

On fourth flat portion 6 of mounting portion 2 is disposed a plurality of second package side electrodes 43 for connection to output terminals 24 of chip resistor array 21. Each second package side electrode 43 is electrically connected to a predetermined electrode pin among the plurality of electrode pins 27 via an internal wiring formed inside package P1.

Output terminals 24 and second package side electrodes 43 are electrically connected via bonding wires 44. Signals are thus sent from CCD chip 11 to the exterior via output terminals OS of CCD chip 11, bonding wires 42, chip resistor arrays 21 (resistors 22), bonding wires 44, second package side electrodes 43, internal wirings, and predetermined electrode pins.

The signal processing circuits for processing signals output from CCD chip 11 shall now be described with reference to FIG. 3.

Each signal processing circuit has resistor 22, which is included in chip resistor array 21, and an operational amplifier 51. Operational amplifier 51 is formed on an external substrate (not shown), etc., onto which solid-state imaging apparatus IS1 (package P1) is mounted.

CCD chip 11 has field-effect transistors 16 for reading potential variations of floating diffusions (not shown), and the gate terminal of each field-effect transistor 16 is electrically connected to the floating diffusion. The source terminal of each field-effect transistor 16 is electrically connected to output terminal OS of CCD chip 11 and is connected via the output terminal OS to input terminal 23 of resistor 22. The drain terminal of each field-effect transistor 16 is electrically connected to a terminal OD, and a voltage that exhibits a fixed positive voltage value is input into the terminal OD. Here, resistor 22 acts as a load resistor and field-effect transistor 16 and resistor 22 make up a source follower circuit.

Output terminal 24 of resistor 22 is electrically connected to the inverted input terminal of operational amplifier 51. A resistor 52 is disposed between the inverted input terminal and the output terminal of operational amplifier 51, and a variable voltage supply 53 is electrically connected to the non-inverted input terminal of operational amplifier 51. The inverted input terminal and the non-inverted input terminal of operational amplifier 51 are in a virtually shorted relationship.

With the present embodiment, a shielding member 35 is positioned with respect to CCD chip 11 so as to shield the front side in the energy ray incident direction of a beveled portion (the inclined portion between thin portion 14 and frame portion 15) of CCD chip 11. The shielding member 35 is formed of a silicon substrate of approximately 300 μm thickness and blocks energy rays (such as light). A through hole 36 of rectangular shape is formed by etching, etc., at a position of shielding member 35 that opposes thin portion 14. Shielding member 35 is adhered and fixed to the back surface 7 side of frame portion 15 of CCD chip 11 by an adhesive agent (not shown), formed of epoxy resin, etc. A recessed portion, which holds shielding member 35 in the state in which CCD chip 11 and spacer 13 are adhered and fixed, is formed at a position of spacer 13 that corresponds to shielding member 35, fixed to frame portion 15 of CCD chip 11, so as to surround the entire periphery of shielding member 35.

As described above, with the present embodiment, chip resistor arrays 21 are positioned on second planar portions 4, which differ from first planar portion 3 on which CCD chip 11 is positioned, and using the step difference between first planar portion 3 and second planar portions 4, CCD chip 11 and chip resistor arrays 21 are positioned proximally. Thus in comparison to an composition (see FIG. 4A), wherein a plurality of resistors (load resistors) 103 are positioned outside a solid-state imaging apparatus 101, the signal transmission paths from CCD chip 11 to chip resistor arrays 21 (resistors 22) are made shorter and the parasitic capacitance of the signal transmission paths is made smaller in solid-state imaging apparatus IS1 of the present embodiment (see FIG. 4B). As a result, the damping of the waveforms of the signals output from CCD chip 11 can be restrained and the high speed response properties can be improved.

Also with the present embodiment, each chip resistor array 21 includes resistors 22 that are electrically connected to output terminals OS of CCD chip 11. With the composition, since resistors 22 that function as load resistors are positioned away from CCD chip 11; even when resistors 22 generate heat, adverse effects on the characteristics of CCD chip 11 (for example, increasing of the dark current) can be prevented.

Since the inverted input terminal and the non-inverted input terminal of each operational amplifier 51 is in a virtually shorted relationship, the electric potential here is always fixed. Charging and discharging of charges therefore will not occur and effects due to the parasitic capacitance of the signal transmission paths from chip resistor arrays 21 to operational amplifier 51 can be neglected substantially.

(Second Embodiment)

Figure 5:
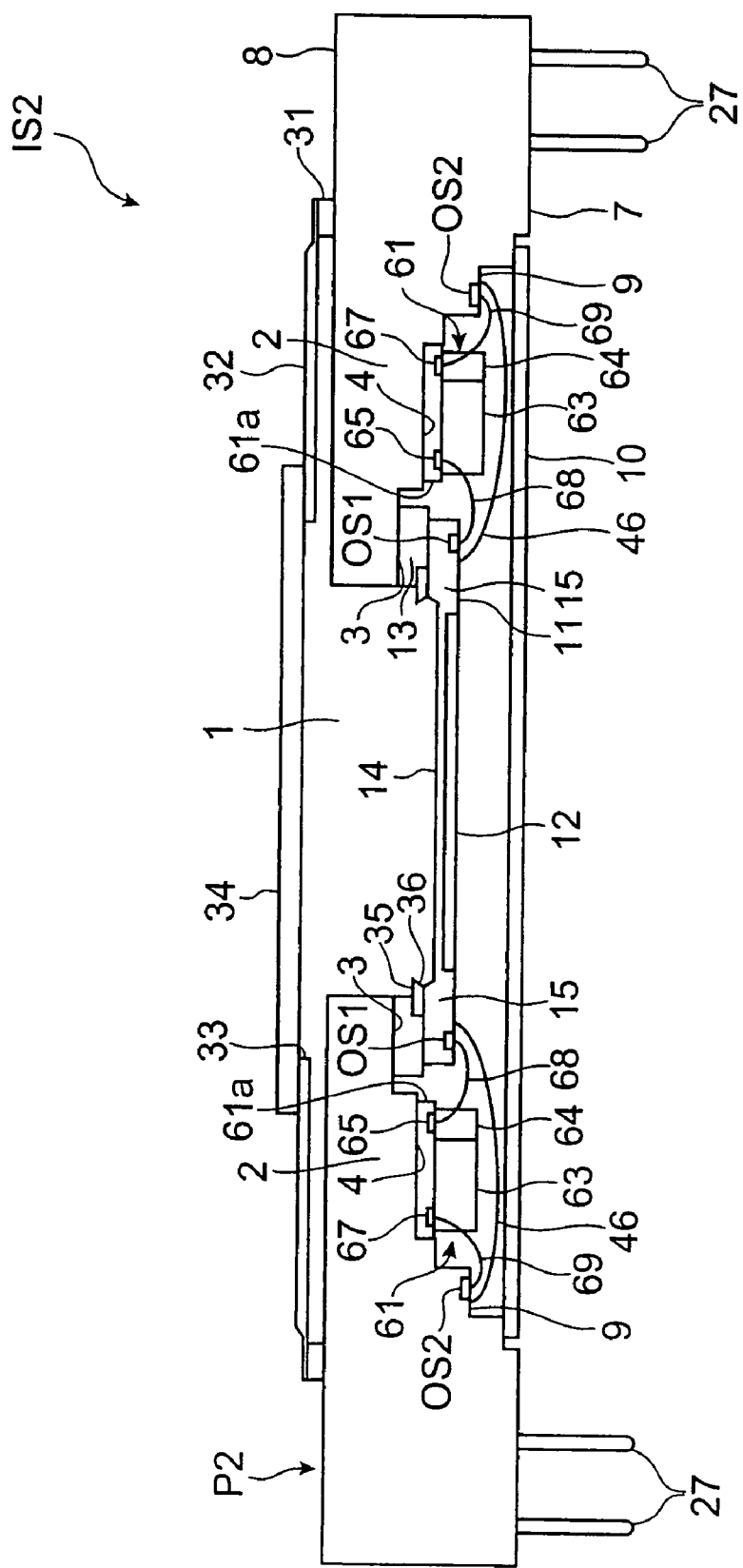
FIG. 5 is a schematic view for describing the sectional composition of a solid-state imaging apparatus of a second embodiment.
Figure 6:
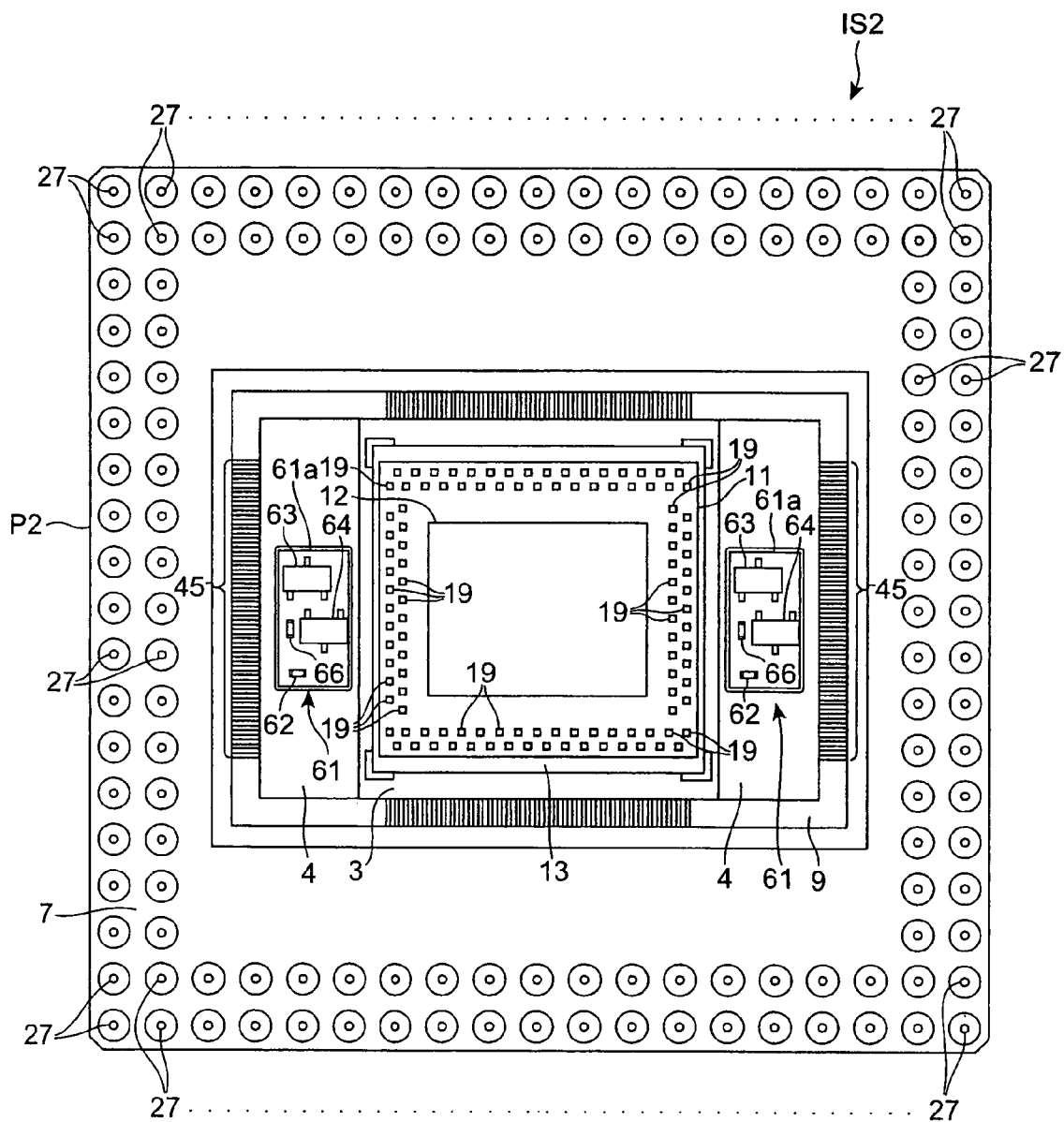
FIG. 6 is a plan view of the solid-state imaging apparatus of the second embodiment.
Figure 7:
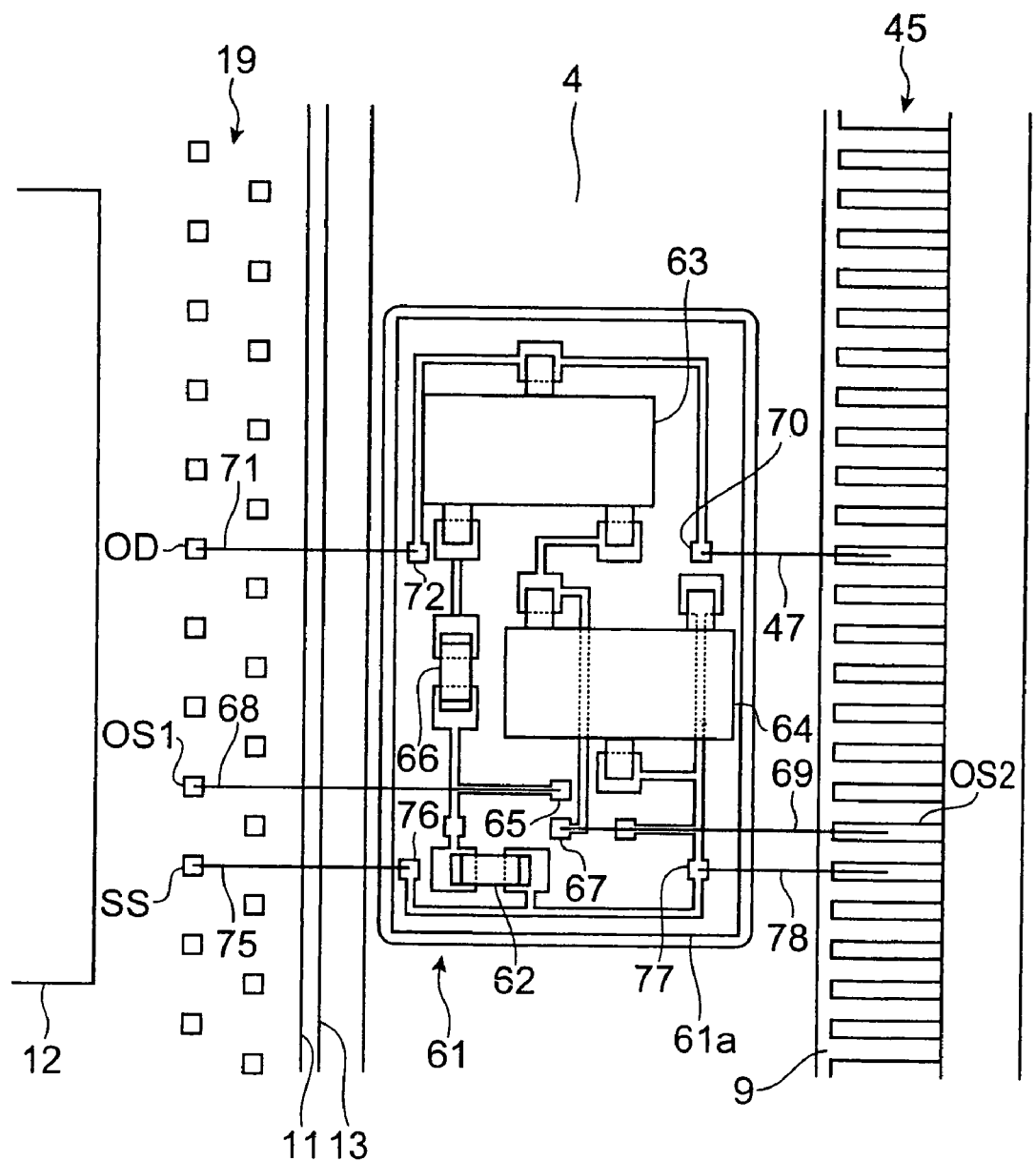
FIG. 7 is a plan view showing the composition of the vicinity of the buffer amplifier module shown in FIG. 6.
Figure 8:
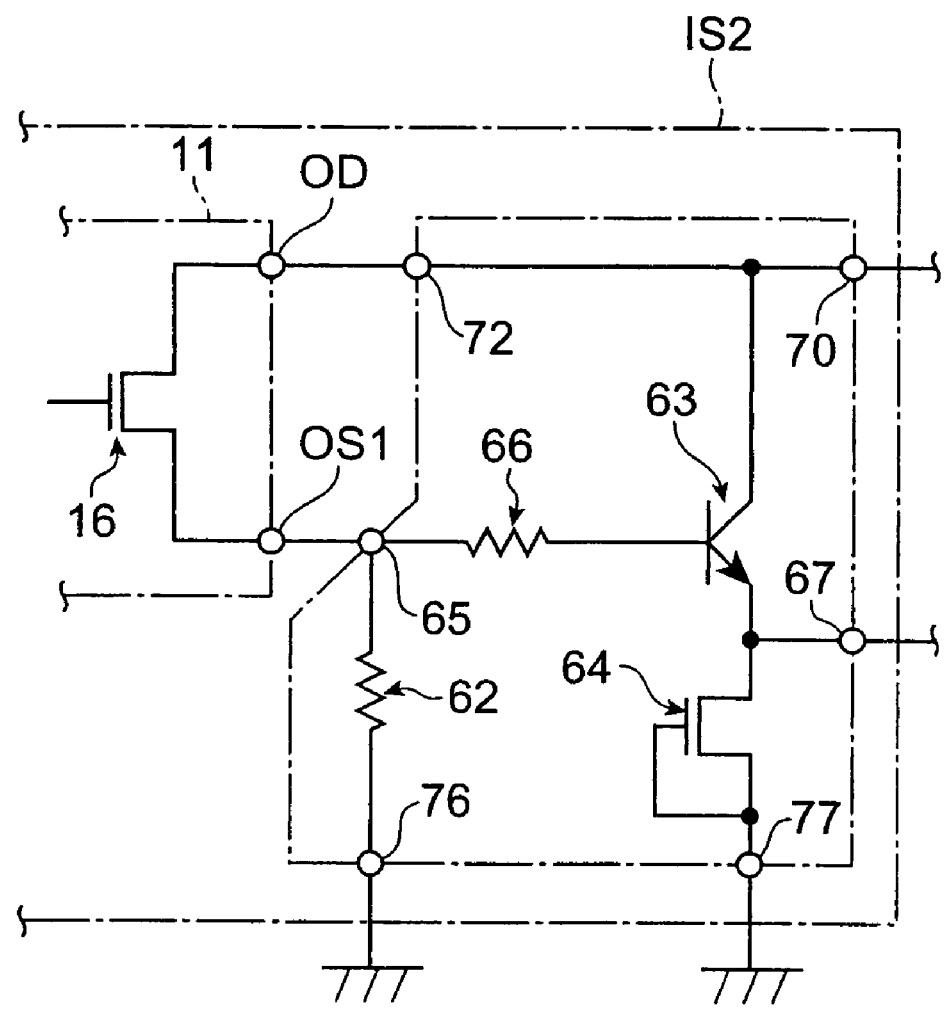
FIG. 8 is a circuit diagram for describing the composition of the buffer amplifier module.

The composition of a solid-state imaging apparatus of a second embodiment shall now be described based on FIGS. 5 to 8. FIG. 5 is a schematic view for describing the sectional composition of the solid-state imaging apparatus of the second embodiment. FIG. 6 is a plan view of the same solid-state imaging apparatus of the second embodiment. FIG. 7 is a plan view showing the composition of the vicinity of a buffer amplifier module. FIG. 8 is a circuit diagram for describing the composition of the buffer amplifier module. FIGS. 6 and 7 are diagrams of the solid-state imaging apparatus as viewed from the back surface side.

A solid-state imaging apparatus IS2 of the second embodiment comprises a package P2, CCD chip 11, buffer amplifier modules 61, which serve as signal processing circuits, etc.

Mounting portion 2 has a first planar portion 3 for positioning CCD chip 11, second planar portions 4 for positioning buffer amplifier modules 61, and a third planar portion 9. Third planar portion 9 is positioned between back surface 7 of package P2 and second planar portions 4 and is formed to be stepped with respect to back surface 7 of package P2 and second planar portions 4. The portion of hollow portion 1 of package P2 at the opposite side of the energy ray incident side portion is sealed by a bottom cover 10.

A plurality of package side electrodes 45 are disposed on third planar portion 9 of mounting portion 2. Each package side electrode 45 is electrically connected to a predetermined electrode pin among the plurality of electrode pins 27 via an internal wiring (not shown) formed inside package P2. Predetermined electrodes among CCD chip side electrodes 19, formed on CCD chip 11, are electrically connected via bonding wires 46 to predetermined electrodes among package side electrodes 45. Transfer signals and other signals are thus sent from the exterior to CCD chip 11 via predetermined electrode pins, internal wirings, predetermined package side electrodes, bonding wires 46, and predetermined CCD chip side electrodes.

As shown in FIGS. 7 and 8, each buffer amplifier module 61 comprises a load resistor 62, a bipolar transistor 63, and a field-effect transistor 64, and load resistor 62, bipolar transistor 63, and field-effect transistor 64 are positioned on a substrate 61a. Each buffer amplifier module 61 (substrate 61 a) is mounted via an adhesive layer (not shown) on a second planar portion 4 of mounting portion 2 and is thereby fixed to the mounting portion 2 (package P2).

An output terminal OS1 (source terminal of a field-effect transistor 16) of CCD chip 11 is electrically connected to an input terminal (electrode) 65 of a buffer amplifier module 61. One terminal of load resistor 62 is electrically connected via input terminal 65 to output terminal OS1 of CCD chip 11 and the other terminal of load resistor 62 is grounded.

The base terminal of bipolar transistor 63 is electrically connected via input terminal 65 and a resistor 66 to output terminal OS1 of CCD chip 11, and the emitter terminal is electrically connected to the drain terminal of field-effect transistor 64 and an output terminal (electrode) 67 of buffer amplifier module 61. The collector terminal of bipolar transistor 63 is electrically connected to a terminal (electrode) 70. As with terminal OD, a voltage, exhibiting a fixed positive voltage value, is input into terminal 70. The gate terminal and source terminal of field effect transistor 64 are grounded. Resistor element 66 is for controlling the base current of bipolar transistor 63. Here, field effect transistor 16 and load resistor 62 make up a source follower circuit.

Output terminal OSI of CCD chip 11 and input terminal 65 of buffer amplifier module 61 are connected via a bonding wire 68. Output terminal 67 of buffer amplifier module 61 is connected via a bonding wire 69 to a predetermined package side electrode OS2. Terminal OD is connected via a bonding wire 71 to a terminal 72 of buffer amplifier module 61 and is electrically connected to terminal 70. Terminal 70 is connected via a bonding wire 47 to a predetermined package side electrode.

A terminal SS of the CCD chip is connected via a bonding wire 75 to a terminal (electrode) 76 of buffer amplifier module 61, and a terminal (electrode) 77 that is electrically connected to the terminal 76 is connected via a bonding wire 78 to a predetermined package side electrode. The predetermined package side electrode is electrically connected to a predetermined electrode pin (ground pin) among electrode pins 27 that is grounded.

As described above, with the present embodiment, buffer amplifier modules 61 are positioned on second planar portions 4, which differ from first planar portion 3 on which CCD chip 11 is positioned, and using the step difference between first planar portion 3 and second planar portions 4, CCD chip 11 and buffer amplifier modules 61 are positioned proximally. Thus in comparison to a composition wherein buffer amplifier modules 203 are positioned outside a solid-state imaging apparatus 201 (see FIG. 9A), the present embodiment's solid-state imaging apparatus IS2 (see FIG. 9B) is made shorter in the signal transmission paths from CCD chip 11 to buffer amplifier modules 61 and thus made smaller in the parasitic capacitance of the signal transmission paths. As a result, the damping of the waveforms of signals output from CCD chip 11 can be restrained and the high-speed response properties can be improved. Buffer amplifier modules 203 in FIG. 9A have the same composition as buffer amplifier modules 61 of the present embodiment.

Also, each buffer amplifier module 61 includes load resistor 62, which has one end connected to output terminal OS1 of CCD chip 11 and the other end grounded, and bipolar transistor 63, which is electrically connected to output terminal OS1 of CCD chip 11. With the composition, since CCD chip 11 and load resistor 62 are positioned apart from each other, even when load resistor 62 generates heat, adverse effects on the characteristics of CCD chip 11 (such as the increasing of the dark current) can be prevented. Also, since bipolar transistor 63 is high in driving ability with respect to load resistor 62, effects due to the parasitic capacitance of the signal transmission path subsequent buffer amplifier module 61 can be alleviated.

Figure 10:
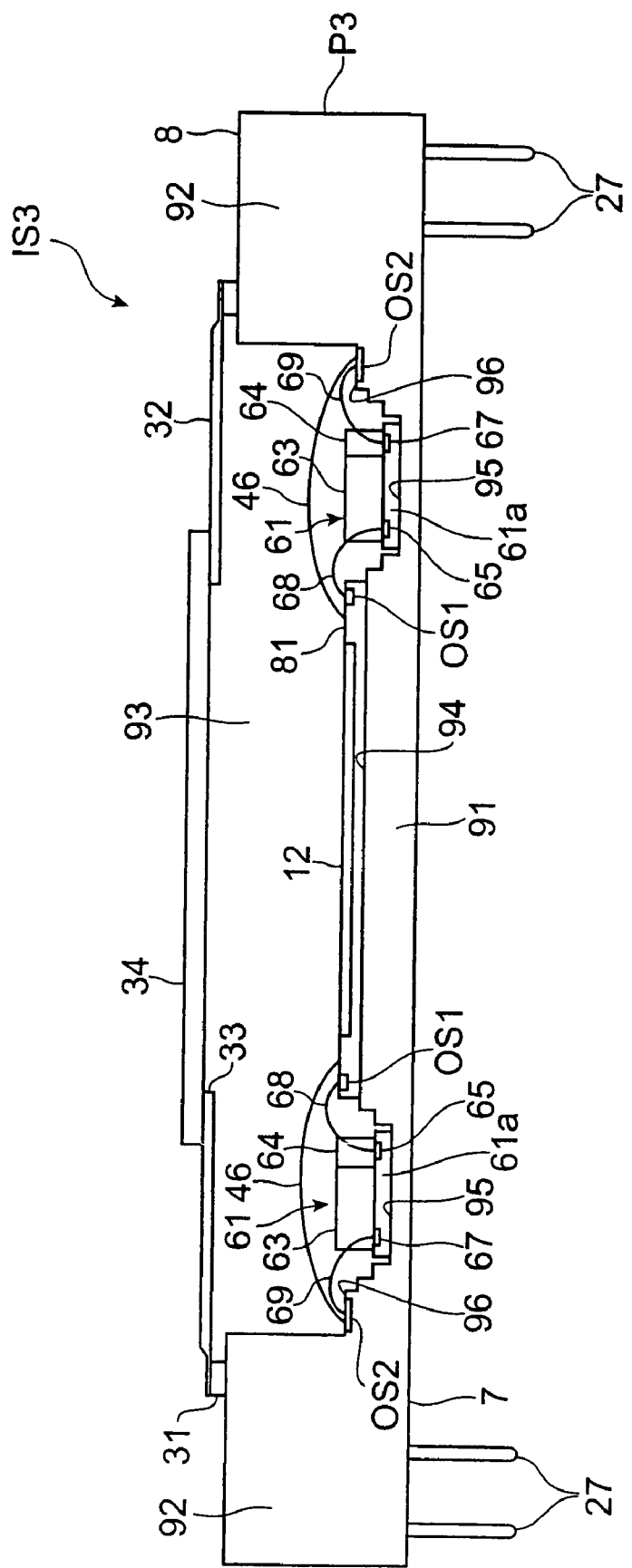
FIG. 10 is a schematic view for describing the sectional composition of a modification example of the solid-state imaging apparatus of the second embodiment.

A modification example of the solid-state imaging apparatus of the second embodiment shall now be described with reference to FIG. 10. FIG. 10 is a schematic view for describing the sectional composition of the modification example of the solid-state imaging apparatus of the second embodiment.

A solid-state imaging apparatus IS3 of the modification example of the second embodiment comprises a package P3, a front-illuminated CCD chip 81, buffer amplifier modules 61, which serve as signal processing circuits, etc.

Package P3 has a recessed portion 93, which is surrounded by a bottom portion 91 and a side portion 92, and is made of ceramic as with the above-described packages P1 and P2. Bottom portion 91 has a first planar portion 94 for positioning CCD chip 81 and second planar portions 95 for positioning buffer amplifier modules 61. First planar portion 94 and second planar portions 95 are formed to be stepped with respect to each other. Bottom portion 91 furthermore has a third planar portion 96, and the third planar portion 96 is positioned between front surface 8 of package P3 and second planar portions 95 and is formed to be stepped with respect to front surface 8 of package P3 and second planar portions 95.

CCD chip 81 has an energy ray sensitive portion 12 and is mounted on first planar portion 94 of bottom portion 91 so that the front surface side will be the energy ray incident surface and is fixed to the bottom portion 91 (package P3).

Buffer amplifier modules 61 are thus positioned on second planar portions 95, which differ from first planar portion 94 on which CCD chip 81 is positioned, and using the step difference between first planar portion 94 and second planar portions 95, CCD chip 81 and buffer amplifier modules 61 are positioned proximally in the present modification example as well. Thus the signal transmission paths from CCD chip 81 to buffer amplifier modules 61 are made short and the parasitic capacitance of the signal transmission paths is made small. As a result, the damping of the waveforms of signals output from CCD chip 81 can be restrained and the high-speed response properties can be improved.

The present invention is not restricted to the embodiments described above. For example, the solid-state imaging apparatus is not restricted to CCD chips 11 and 81 and may be formed of a photodiode (PD) array of amorphous silicon and a thin-film transistor (TFT) or may be a MOS type image sensor.

INDUSTRIAL APPLICABILITY

The present invention can be applied to a solid-state imaging apparatus, such as a CCD image sensor.

The invention claimed is:

1. A solid-state imaging apparatus comprising:
 a package having,
  a hollow portion that extends in a predetermined direction of the package, and
  a mounting portion that protrudes into the hollow portion and includes a first planar portion and a second planar portion formed stepped with respect to the first planar portion;
 a solid-state imaging element disposed on the first planar portion of the mounting portion and having an energy ray sensitive portion; and
 a signal processing circuit disposed on the second planar portion and that processes signals output from said solid-state imaging element and including a load resistor electrically connected to an output terminal of the solid-state imaging element;
 wherein the load resistor and the output terminal of the solid-state imaging element are electrically and directly connected via a bonding wire,
 wherein the signal processing circuit is positioned alongside the solid-state imaging element when viewed from a direction perpendicular to the planar portion at which the solid-state imaging element is positioned, and wherein the first planar portion and the second planar portion are positioned in the hollow portion.

2. A solid-state imaging apparatus comprising:

a package having, a hollow portion that extends in a predetermined direction of the package, and a mounting portion that protrudes into the hollow portion and includes a first planar portion and a second planar portion formed stepped with respect to the first planar portion;

a solid-state imaging element disposed on the first planar portion and having an energy ray sensitive portion; and a signal processing circuit disposed on the second planar portion and that processes signals output from the solid-state imaging element and including a load resistor electrically connected to an output terminal of the solid-state imaging element;

wherein the package has a first planar portion and a second planar portion, formed to be stepped with respect to the first planar portion, the second planar portion is positioned alongside the first planar portion when viewed from a direction perpendicular to the first and second planar portion, wherein the load resistor and the output terminal of the solid-state imaging element are electrically and directly connected via a bonding wire, and wherein the first planar portion and the second planar portion are positioned in the hollow portion.

3. The solid-state imaging apparatus according to claim 1 or 2, wherein one end of the load resistor is electrically connected to the output terminal of the solid-state imaging element and the other end of the load resistor is grounded; and wherein the signal processing circuit further includes a buffer amplifier, having a bipolar transistor that is electrically connected to the output terminal of the solid-state imaging element.

4. The solid-state imaging apparatus according to claim 1 or 2, wherein the signal processing circuit further includes a field-effect transistor making up a source follower circuit with the load resistor.

* * * * *